United States Patent
Qi et al.

(10) Patent No.: US 8,041,537 B2
(45) Date of Patent: Oct. 18, 2011

(54) CLOCK DUTY CYCLE MEASUREMENT WITH CHARGE PUMP WITHOUT USING REFERENCE CLOCK CALIBRATION

(75) Inventors: Jieming Qi, Austin, TX (US); Eskinder Hailu, Sunnyvale, CA (US); David William Boerstler, Round Rock, TX (US); Masaaki Kaneko, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 12/163,081

(22) Filed: Jun. 27, 2008

(65) Prior Publication Data

US 2009/0326862 A1    Dec. 31, 2009

(51) Int. Cl.
*G04F 1/00* (2006.01)
(52) U.S. Cl. .......................................................... 702/176
(58) Field of Classification Search .................... 702/176
See application file for complete search history.

(56) References Cited

U.S. PATENT DOCUMENTS

| | | | |
|---|---|---|---|
| 4,859,944 A | 8/1989 | Webb | |
| 5,542,083 A * | 7/1996 | Hotta et al. | 713/375 |
| 6,664,834 B2 | 12/2003 | Nair et al. | |
| 2003/0042957 A1 * | 3/2003 | Tamura | 327/233 |
| 2005/0225314 A1 | 10/2005 | Belleau | |

\* cited by examiner

*Primary Examiner* — Aditya Bhat
(74) *Attorney, Agent, or Firm* — Hamilton & Terrile, LLP; Gary W. Hamilton

(57) ABSTRACT

Embodiments of the disclosure provide systems and methods for clock duty cycle measurement. A clock signal and a complement of the clock signal are provided to a charge pump during first and second predetermined timing windows. A charge pump is operable to generate first and second output voltages in response to the clock signal and the complement of the clock signal during the first and second timing windows, respectively. In addition a predetermined positive voltage and a ground voltage are applied to the charge pump during predetermined third and fourth timing windows, respectively. The charge pump is operable to generate third and fourth output voltage signals corresponding to the predetermined positive and ground voltages during the third and fourth timing windows, respectively. The first, second, third and fourth voltages are then used to calculate the duty cycle of the clock.

20 Claims, 4 Drawing Sheets

| Operation mode | SW_up | SW_dn |
|---|---|---|
| Vc init | vdd | gnd |
| Clk mode | clk | clk |
| Clk_b mode | clk_b | clk_b |
| Charge dn mode | vdd | vdd |
| charge up mode | gnd | gnd |
| Steady state | vdd | gnd |

*Figure 3*

CLOCK DUTY CYCLE MEASUREMENT WITH CHARGE PUMP WITHOUT USING REFERENCE CLOCK CALIBRATION

BACKGROUND OF THE INVENTION

1. Field of the Invention

The present invention relates in general to the field of computer circuitry. More specifically, embodiments of the invention are systems and methods for measuring a clock duty cycle without using a reference clock for calibration.

2. Description of the Related Art

The duty-cycle of a high-speed clock is a very important aspect of modern integrated circuits, such as high-performance microprocessors. For example, either the positive or the negative cycle of a clock can be used for memory access and the memory access speed is directly related to the duration of the clock pulse and thus the duty cycle. In theory, a fifty percent duty cycle clock is preferred from a phase-locked loop (PLL) and the clock distribution circuitry. However, the optimum duty cycle of a clock for maximum system performance will vary from one circuit to another due to process variation and model-to-hardware correlation.

In general it is difficult to measure the duty cycle of a clock, since any logic that is used to extract the duty cycle of a clock will also lead to duty cycle degradation of the original clock. In addition, most prior techniques for measuring the duty cycle of a clock require an off-chip reference clock for calibration.

To help optimize design, it is preferable to calculate the duty cycle of a clock using on-chip hardware. A clock duty cycle is sensitive to many different factors, including operating frequency, operating temperature, supply voltage, circuit design style, circuit loading, and process (e.g., variations in the doping, threshold voltage, mobility, gate oxide thickness, etc. across single and/or multiple wafers). Because so many different factors may affect duty cycle, it is important to be able to accurately measure clock duty cycle at the point of use on the chip under actual operating conditions.

It is apparent, therefore, that there is a need for an improved system and method for measuring the duty cycle of a clock using on-chip hardware without a reference clock.

SUMMARY OF THE INVENTION

Embodiments of the invention provide systems and methods for clock duty cycle measurement that are accurate, low cost and easily implemented on-chip. In embodiments of the invention, the duty-cycle of a clock is extracted from hardware without the need for a reference clock calibration.

In various embodiments of the invention for measuring the duty cycle of a clock, a clock signal and a complement of the clock signal are provided to a charge pump during first and second predetermined timing windows. A charge pump is operable to generate first and second output voltages in response to the clock signal and the complement of the clock signal during the first and second timing windows, respectively. In addition a predetermined positive voltage and a ground voltage are applied to the charge pump during predetermined third and fourth timing windows, respectively. The charge pump is operable to generate third and fourth output voltage signals corresponding to the predetermined positive and ground voltages during the third and fourth timing windows, respectively. The first, second, third and fourth voltages are then used to calculate the duty cycle of the clock.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 3 is a chart illustrating control signal settings for various operational modes in accordance with embodiments of the invention.

DETAILED DESCRIPTION

Embodiments of systems and methods are disclosed for measuring a clock duty cycle without using a reference clock for calibration. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified drawings in order to avoid limiting or obscuring the present invention. Such descriptions and representations are used by those skilled in the art to describe and convey the substance of their work to others skilled in the art. Various illustrative embodiments of the present invention will now be described in detail with reference to the figures.

Figure 1:
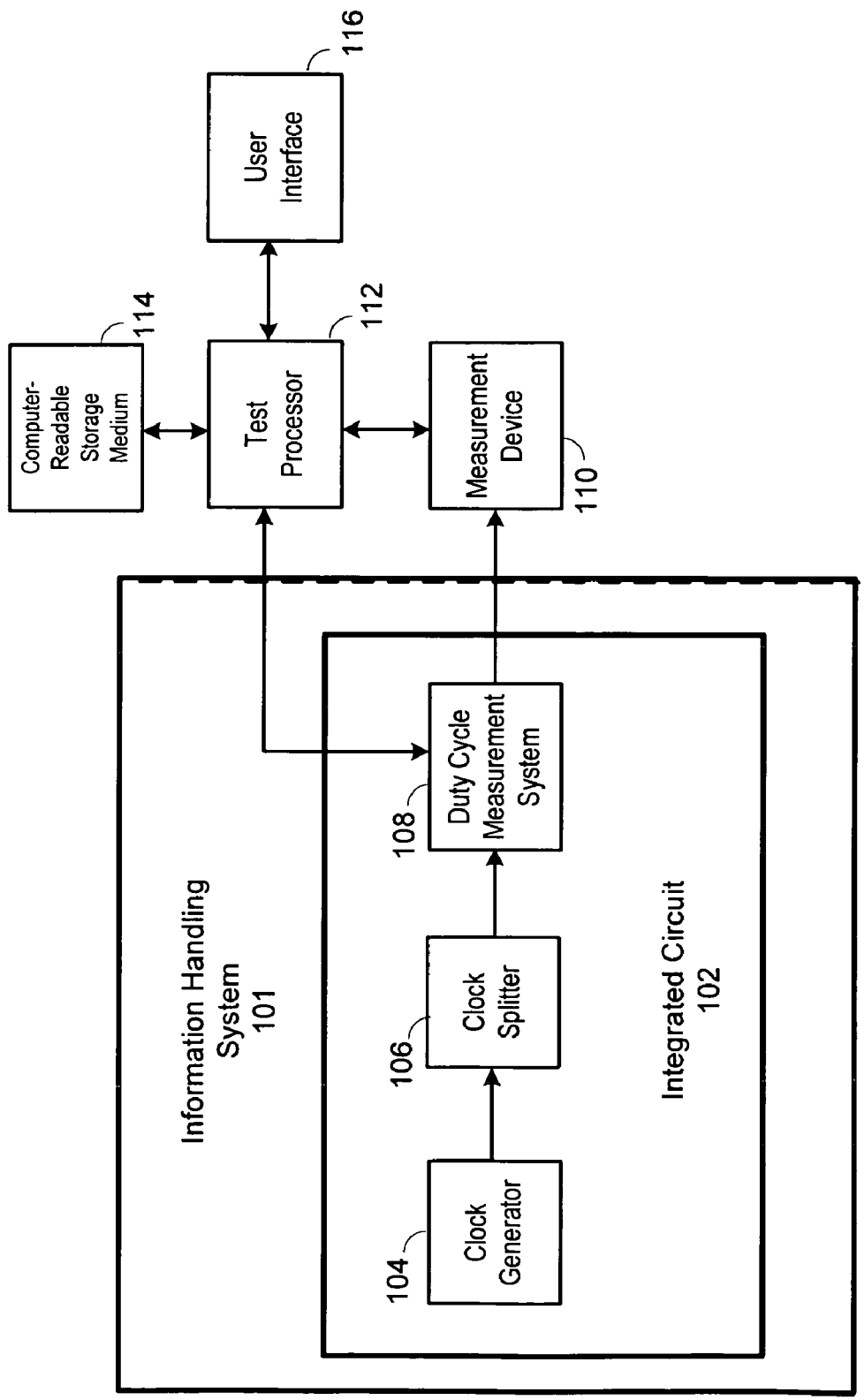
FIG. 1 is a general illustration of an on-chip clock duty cycle measurement system in accordance with an illustrative embodiment of the invention.

FIG. 1 is a general illustration of an on-chip clock duty cycle measurement system used to measure the clock duty cycle for an integrated circuit 102 in accordance with an illustrative embodiment of the invention. As will be understood by those of skill in the art, embodiments of the local clock duty cycle measurement circuitry described herein can be embedded in a plurality of data processing circuits in integrated circuits that are used to process data in an information handling system 101, shown in FIG. 1, and in a wide range of other applications.

A single-ended clock signal generated by clock generator 104 is provided to a clock splitter 106 that is operable to generate "true" and "complement" clock signals for processing by the duty cycle measurement system 108, as described in greater detail hereinbelow. The output of the duty cycle measurement system is provided to an appropriate measurement device 110, such as a high-impedance voltage meter. A test processor 112 is operable to execute appropriate computer code, stored in a computer-readable medium 114, to provide the processing steps described in greater detail below, and to display the results of the processing steps on a user interface 116.

Figure 2:
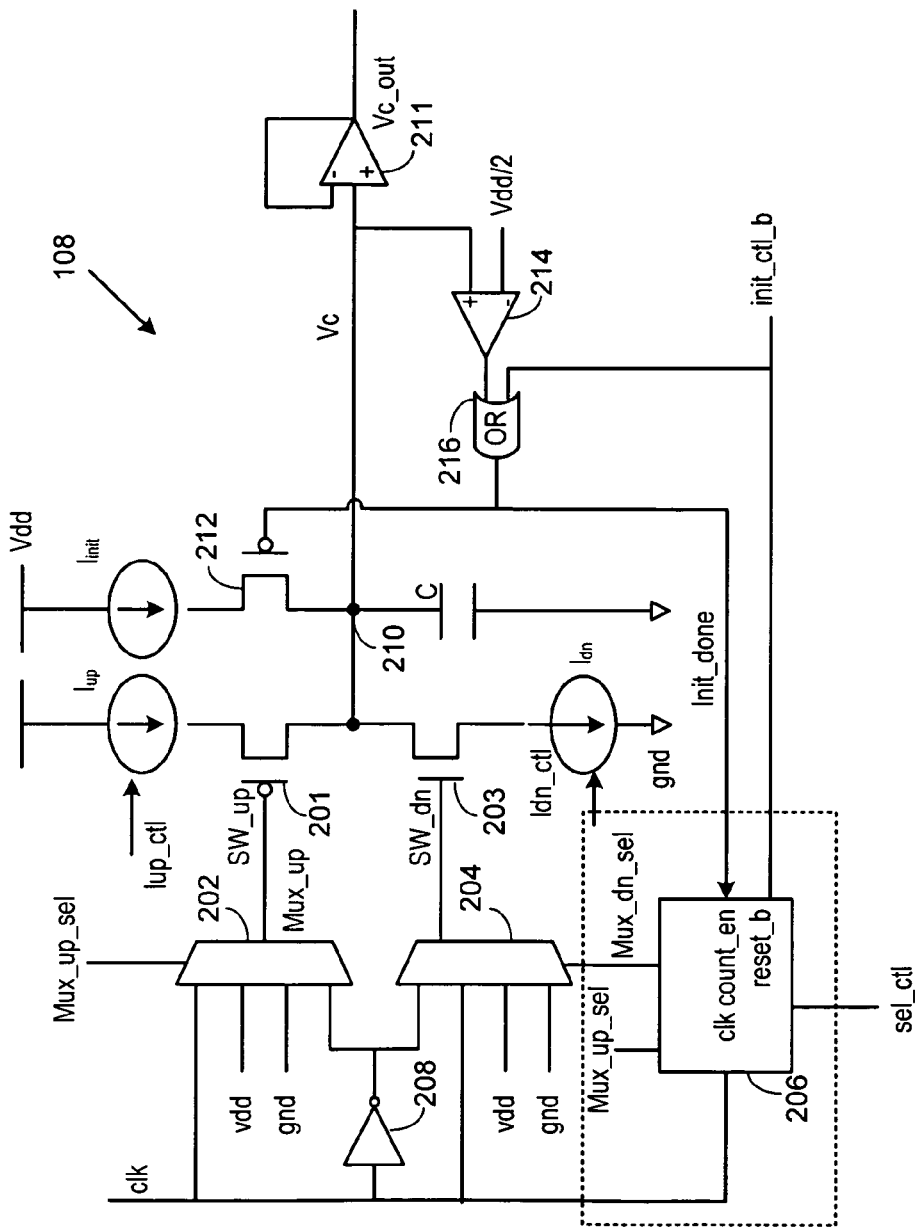
FIG. 2 is an exemplary circuit diagram of an on-chip duty cycle measurement system in accordance with one illustrative embodiment.

FIG. 2 is an exemplary circuit diagram of an on-chip duty cycle measurement system 108 in accordance with one illustrative embodiment of the invention. As discussed in greater detail hereinbelow, the duty cycle measurement system 108 comprises a two charge pumps, implemented with transistors 201 and 203, that receive the true and complement clock signals and generate output voltages that can be used to calculate the duty cycle of the original clock signal.

Prior to discussing operation of the various components shown in FIG. 2, the mathematical basis for calculating a clock duty cycle using the voltages generated by a charge pump in response to a clock signal will be discussed. The following equation provides the relationship between voltage and clock duty cycle when a clock signal is provided to a charge pump:

$$\delta V=(I/C)*(1-2*dcc)*T*N \quad (1)$$

where, T is the period of the clock, dcc is the duty cycle of the clock, which is the high duration of the pulse divided by the period, N is the number of cycles for the clock, and "T*N" is the total time or "timing window." C is the capacitance of the capacitor in the charge pump, I is the charge pump current, and $\delta V$ is the voltage change on the capacitor C.

For an ideal charge pump, a 50% duty cycle clock will result in no voltage change. Over 50% dcc clock will result in a negative $\delta V$ while less than 50% dcc will result in positive dV. In practice, the up and dn currents cannot be fully matched and transient overshoot or undershoot can also occur. As a result, a 50% dcc clock can lead to change of voltage V at the capacitor and $\delta V$ will not equal to zero. To account for the offset due to nonideal effects, prior techniques generally used a reference clock with known duty cycle for calibration. In real applications, the reference clocks for calibration might not be easily available.

For a non-ideal charge pump, assume the dn current is I and up current is I+$\delta$I, then (1) can be rewritten as $$\delta V=(T*N/C)*[I+\delta I-(2I+\delta I)*dcc] \quad (2)$$

Or $$dcc=(I+\delta I)/(2I+\delta I)-\delta V*C/(T*N*(2I+\delta I)) \quad (3)$$

For a charge pump, I and $\delta$I are constant when the charge pump voltage is in the operation voltage range. C is fixed after manufacturing. T is known for the clock, and N can be set to be constant in the circuit configuration. Therefore, (3) can be rewritten as $$dcc=A+\delta V*B$$

Here, $A=(I+\delta I)/(2I+\delta I)$, $$B=-C/(T*N*(2I+\delta I)) \quad (4)$$

Equations (2) to (4) apply to all dcc clock embodiments including dcc=1 where it is charge down mode and dcc=0 where it is charge up mode. The values for A and B can be obtained using the following procedure: First the original clock, with a duty cycle of dcc, is connected to the charge pump circuit and $\delta V$ is measured as $\delta Va$. The same procedure is then followed using the complement clock and V is measured as $\delta Vb$. From (4), the following relationships are obtained:

$$dcc=A+\delta Va*B \quad (5)$$

$$1-dcc=A+\delta Vb*B \quad (6)$$

Combining (5) and (6), the following relationship is obtained:

$$2A+(\delta Va+\delta Vb)*B=1 \quad (7)$$

It is necessary to have another set of equations to determine A and B. To obtain the other two relationships, the charge up and charge down modes can be used. Since $\delta V$ will be much higher if using the same timing window (T*N), it is possible that the charge pump will operate outside the voltage range. To avoid this problem, it is possible to used a small timing window (T*M) where M<N. In practice, both M, and N can be configurable to obtain the best results. In this case, equation (4) will become the following $$dcc=A+\delta V*Bm$$

Here, $A=(I+\delta I)/(2I+\delta I)$, $$Bm=-C/(T*M*(2I+\delta I)) \quad (8)$$

Equation (8) can be rewritten as:

$$dcc=A+\delta V*B*N/M$$

Next, a DC high and low is applied to the charge pump circuits with a timing window of (T*M) and the $\delta$=V is measured as $\delta Vc$ and $\delta Vd$, respectively. The following equations are measured from (8):

$$1=A+\delta Vc*B*N/M \quad (9)$$

$$0=A+\delta Vd*B*N/M \quad (10)$$

From (9) and (10), the following relationship is obtained:

$$B=M/(N*(\delta Vc-\delta Vd)) \quad (11)$$

Substituting (11) into (7), the value for A can be obtained as:

$$A=0.5-(M/2N)*(\delta Va+\delta Vb)/(\delta Vc-\delta Vd) \quad (12)$$

Substituting (11) and (12) into (5), the dcc of the original clock is obtained as:

$$dcc=0.5-(M/2N)*(\delta Va+\delta Vb)/(\delta Vc-\delta Vd)+M/N*\delta Va/(\delta Vc-\delta Vd) \quad (13)$$

Therefore, dcc of the clock can be simply extracted by measuring $\delta Va$, $\delta Vb$, $\delta Vc$, and $\delta Vd$. M/N is a configurable constant. No reference clock is needed for calibration.

Referring again to FIG. 2, the clock signal, clk, is provided to multiplexers 202 and 204 and to a control and clock counter module 206. The clk signal is also provided to an inverter 208 that is operable to generate inverted clk signals as inputs to multiplexers 202 and 204. In addition to the clk and inverted clk signals, the multiplexers 202 and 204 are also provide with vdd and gnd signals. The various output voltages obtained using the processing sequences discussed hereinabove are measured using the capacitor voltage at node 210.

The duty cycle measurement system 108 can be used to measure the clock duty cycle using the following sequence: First, Vc node 210 is initialized to "vdd/2" by activating transistor and allowing current, Iinit, to pass through the capacitor, C, thereby increasing the voltage, Vc, at node 210. When the voltage at node 210 reaches Vdd/2, comparator 214 generates a "true" output signal and OR gate 216 then generates a "true" output signal that turns off transistor 212. The initial Vc, equal to Vdd/2 is read from the output of the unity gain buffer 211. Next, the test clock is applied to the charge pump with timing window of (T*N) and Vc node 210 is read to obtain $\delta Va$. Next, the complement of the test clock is applied to the charge pump with timing window of (T*N) and Vc is read at node 210 to obtain $\delta Vb$. Next, Vdd is applied to the charge pump with timing window of (T*M) and Vc is read at node 210 to obtain $\delta Vc$. Next, gnd is applied to the charge pump with timing window of (T*M) and Vc is read at node 210 to obtain $\delta Vd$. The dcc of the clock is then calculated using the values of $\delta Va$, $\delta Vb$, $\delta Vc$, and $\delta Vd$, in formula (13) discussed above.

It should be noted that the non-zero term for ($\delta Va+\delta Vb$) in step (2) and (3) is caused by the combination of current mismatch and transient current overshoot and undershoot, but the relative contribution of transient current mismatch is relatively small. For this reason, this dcc measurement method gives best results when transient current overshoot and undershoot are minimal.

As an example, the operation of the duty cycle measurement system 108 was simulated using the following parameters:

C=24 pF,
N=50,
M=5,
I=150 uA,
δI=−10 uA,

Using the procedure discussed above, the following readings were obtained using the methodology discussed above for a 1 Ghz, 40% duty cycle clock:

(1) Vc=752 mV
(2) Vc=789 mV and δVa=37 mV
(3) Vc=681 mV, and δVb=−71 mV
(4) Vc=721 mV, δVc=−31 mV
(5) Vc=772 mV and δVd=29 mV Substituting the above-referenced voltages into formula (13) provides a resulting dcc of 41%.

FIG. 3 is a chart illustrating control signal settings for various operational modes of the duty cycle measurement system 108 in accordance with embodiments of the invention.

Figure 4:
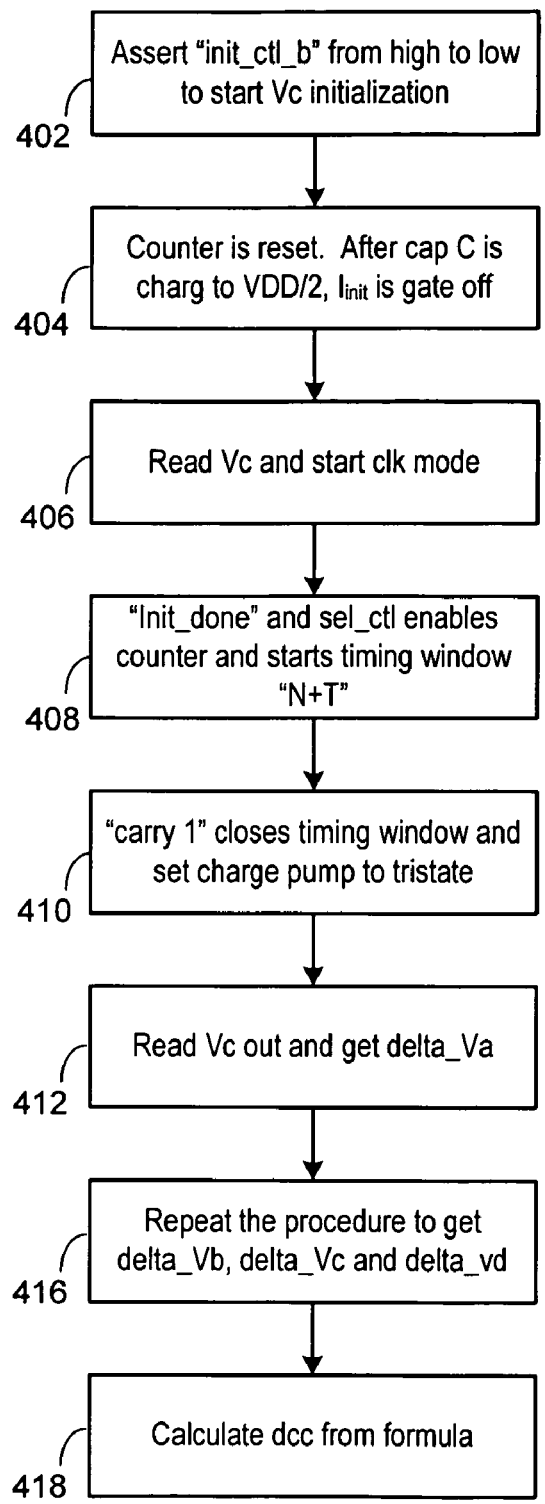
FIG. 4 is an illustrative process flowchart of steps for implementing embodiments of the on-chip clock duty cycle measurement system and method.

FIG. 4 is an illustrative process flow chart of steps for implementing embodiments of the on-chip clock duty cycle measurement system and method. In step 402 the "init_ctl_b" signal is asserted from high to low to start initialization of Vc. In step 404 the counter is reset and the Iinit gate is turned off after Vc is charged to VDD/2. In step 406, Vc is read and the clk mode is started. In step 408, "Init_done" is signaled and "set_ctl" enables the counter and starts the timing window "N+T." In step 410, the "carry 1" signal is used to close the timing window and to set the charge pump to tristate. In step 412, Vc is read and delta_Va is obtained therefrom. Steps 404-412 are then repeated to obtain the values for delta_Vb, delta_Vc, and delta_Vd. Processing then proceeds to step 418 where dcc is calculated using the formulas discussed hereinabove.

The method to calculate dcc using the embodiments described herein is very simple to implement in a manufacturing environment. It only requires high impedance voltage meters and software programming can be used to make it entirely automatic.

Although the described exemplary embodiments disclosed herein are directed to various examples of improved systems and methods for measuring a clock duty cycle without using a reference clock for calibration, the present invention is not necessarily limited to the example embodiments. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of measuring the duty cycle of a clock, comprising:
    providing a clock signal and a complement of said clock signal to a charge pump during first and second predetermined timing windows;
    using said charge pump to generate first and second output voltages in response to said clock signal and said complement of said clock signal during said first and second timing windows, respectively;
    applying a predetermined positive voltage and a ground voltage to said charge pump during predetermined third and fourth timing windows, respectively;
    using said charge pump to generate third and fourth output voltages corresponding to said predetermined positive and ground voltages during said third and fourth timing windows, respectively; and
    using a test processor to process said first, second, third, and fourth output voltages to calculate the duty cycle of said clock.

2. The method of claim 1, wherein said charge pump comprises a capacitor and the output voltages are measured at a first node of said capacitor.

3. The method of claim 2, wherein said capacitor is initially charged to a capacitance value corresponding to a voltage value equal to one-half said predetermined positive voltage value applied to said charge pump during said third timing window.

4. The method of claim 3, wherein said first, second, third, and fourth output voltages are calculated as the difference between the initial voltage of said first node of said capacitor and the voltage of said first node of said capacitor at the end of said first, second, third, and fourth timing windows, respectively.

5. The method of claim 1, wherein the duration of said first and second timing windows is equal to the value T*N, where T is the period of the clock and N is the number of cycles of the clock during said first and second timing windows.

6. The method of claim 5, wherein the duration of said third and fourth timing windows is equal to the value T*M, where T is the period of the clock and M is the number of cycles of the clock during said third and fourth timing windows, and wherein M is less than N.

7. The method of claim 1, wherein the circuitry for generating said clock signal and the circuitry for implementing said charge pump is fabricated on a common integrated circuit substrate.

8. A system of measuring the duty cycle of a clock, comprising:
    clock generation circuitry operable to generate a clock signal and a complement of said clock signal;
    a charge pump;
    processing logic operable to:
        provide said clock signal and said complement of said clock signal to said a charge pump during first and second predetermined timing windows; and apply a predetermined positive voltage and a ground voltage to said charge pump during predetermined third and fourth timing windows, respectively;

wherein said charge pump is operable to:

generate first and second output voltages in response to said clock signal and said complement of said clock signal during said first and second timing windows, respectively; and generate third and fourth output voltages corresponding to said predetermined positive and ground voltages during said third and fourth timing windows, respectively; and processing logic operable to use said first, second, third, and fourth output voltages to calculate the duty cycle of said clock.

9. The system of claim 8, wherein said charge pump comprises a capacitor and the output voltages are measured at a first node of said capacitor.

10. The system of claim 9, wherein said capacitor is initially charged to a capacitance value corresponding to a voltage value equal to one-half said predetermined positive voltage value applied to said charge pump during said third timing window.

11. The system of claim 10, wherein said first, second, third, and fourth output voltages are calculated as the difference between the initial voltage of said first node of said capacitor and the voltage of said first node of said capacitor at the end of said first, second, third, and fourth timing windows, respectively.

12. The system of claim 8, wherein the duration of said first and second timing windows is equal to the value T*N, where T is the period of the clock and N is the number of cycles of the clock during said first and second timing windows.

13. The system of claim 12, wherein the duration of said third and fourth timing windows is equal to the value T*M, where T is the period of the clock and M is the number of cycles of the clock during said third and fourth timing windows, and wherein M is less than N.

14. The system of claim 8, wherein the circuitry for generating said clock signal and the circuitry for implementing said charge pump is fabricated on a common integrated circuit substrate.

15. An information handling system, comprising:

a plurality of integrated circuits operable coupled to process data, wherein at least one integrated circuit comprises:

clock generation circuitry operable to generate a clock signal and a complement of said clock signal;

a charge pump;

processing logic operable to:

provide said clock signal and said complement of said clock signal to said a charge pump during first and second predetermined timing windows; and apply a predetermined positive voltage and a ground voltage to said charge pump during predetermined third and fourth timing windows, respectively;

wherein said charge pump is operable to:

generate first and second output voltages in response to said clock signal and said complement of said clock signal during said first and second timing windows, respectively; and generate third and fourth output voltages corresponding to said predetermined positive and ground voltages during said third and fourth timing windows, respectively; and processing logic operable to use said first, second, third and fourth output voltages to calculate the duty cycle of said clock.

16. The information handling system of claim 15, wherein said charge pump comprises a capacitor and the output voltages are measured at a first node of said capacitor.

17. The information handling system of claim 16, wherein said capacitor is initially charged to a capacitance value corresponding to a voltage value equal to one-half said predetermined positive voltage value applied to said charge pump during said third timing window.

18. The information handling system of claim 17, wherein said first, second, third, and fourth output voltages are calculated as the difference between the initial voltage of said first node of said capacitor and the voltage of said first node of said capacitor at the end of said first, second, third, and fourth timing windows, respectively.

19. The information handling system of claim 15, wherein the duration of said first and second timing windows is equal to the value T*N, where T is the period of the clock and N is the number of cycles of the clock during said first and second timing windows.

20. The information handling system of claim 19, wherein the duration of said third and fourth timing windows is equal to the value T*M, where T is the period of the clock and M is the number of cycles of the clock during said third and fourth timing windows, and wherein M is less than N.

* * * * *